(12) United States Patent
Kreupl et al.

(10) Patent No.: US 7,910,210 B2
(45) Date of Patent: Mar. 22, 2011

(54) METHOD OF PRODUCING A LAYER ARRANGEMENT, METHOD OF PRODUCING AN ELECTRICAL COMPONENT, LAYER ARRANGEMENT, AND ELECTRICAL COMPONENT

(75) Inventors: Franz Kreupl, Munich (DE); Maik Liebau, Dresden (DE); Georg Duesberg, Dresden (DE); Christian Kapteyn, Dresden (DE)

(73) Assignee: Rising Silicon, Inc., Austin, TX (US)

( * ) Notice: Subject to any disclaimer, the term of this patent is extended or adjusted under 35 U.S.C. 154(b) by 830 days.

(21) Appl. No.: 11/602,460

(22) Filed: Nov. 20, 2006

(65) Prior Publication Data

US 2007/0122621 A1    May 31, 2007

(30) Foreign Application Priority Data

Nov. 25, 2005   (DE) .................. 10 2005 056 262

(51) Int. Cl.
*B32B 9/00*    (2006.01)
*C23C 16/00*   (2006.01)

(52) U.S. Cl. ..... 428/408; 428/698; 428/702; 427/249.1; 427/249.17

(58) Field of Classification Search .......... 428/408, 428/698, 699; 438/622, 628, 723, 627, 240
See application file for complete search history.

(56) References Cited

U.S. PATENT DOCUMENTS

| | | | | |
|---|---|---|---|---|
| 5,368,938 A | * | 11/1994 | Holzl et al. | 428/408 |
| 6,071,615 A | * | 6/2000 | Solow et al. | 428/408 |
| 6,144,546 A | * | 11/2000 | Mizushima et al. | 361/303 |
| 6,630,396 B2 | | 10/2003 | Yang et al. | |
| 2005/0101154 A1 | | 5/2005 | Huang | |

FOREIGN PATENT DOCUMENTS

| | | |
|---|---|---|
| DE | 103 45 393 A1 | 5/2005 |
| DE | 103 59 889 A1 | 7/2005 |
| WO | WO 2005/033358 A2 | 4/2005 |

OTHER PUBLICATIONS

Seekamp et al., PECVD a-SiC:H thin films from liquid organosilanes dependence of photoluminescence on starting material, Journal of Non-Crystalline Solids 266-269 (2000) pp. 704-707.*
Narushima et al., Oxidation of silicon and silicon carbide in ozone-containing atmospheres at 973 K, Journal of the Americal Ceramic Society, 85 (2002) pp. 2049-2055.*
Pierson, H., O., "The CVD of Ceramic Materials: Carbides," Handbook of Chemical Vapor Deposition: Principles, Technology and Applications, 1999, pp. 231-264, Second Edition, Noyes Publications.

* cited by examiner

*Primary Examiner* — Timothy M Speer

(74) *Attorney, Agent, or Firm* — Marger Johnson & McCollom, P.C.

(57) ABSTRACT

In a method of producing a layer arrangement, a substantially carbon-comprising, electrically conductive carbon layer is formed. A protective layer is formed on the carbon layer. An electrically insulating layer is formed on the protective layer, the protective layer protecting the carbon layer from damage during the formation of the electrically insulating layer. Furthermore, a layer arrangement is provided, having a substantially carbon-comprising, electrically conductive carbon layer, a protective layer formed on the carbon layer, and an electrically insulating layer formed on the protective layer, the protective layer being used to avoid damage to the carbon layer by the electrically insulating layer.

22 Claims, 2 Drawing Sheets

METHOD OF PRODUCING A LAYER ARRANGEMENT, METHOD OF PRODUCING AN ELECTRICAL COMPONENT, LAYER ARRANGEMENT, AND ELECTRICAL COMPONENT

This application claims priority to German Patent Application 10 2005 056 262.0-33, which was filed Nov. 25, 2005, and is incorporated herein by reference.

TECHNICAL FIELD

The invention relates to a method of producing a layer arrangement, a method of producing an electrical component, a layer arrangement, and an electrical component.

BACKGROUND

It is desirable to protect a carbon layer from damage, which damage is caused by the formation of an electrically insulating layer on the carbon layer.

SUMMARY OF THE INVENTION

In accordance with one embodiment of the invention a method of producing a layer arrangement is provided. In the method, a substantially carbon-comprising, electrically conductive carbon layer is formed. A protective layer is formed on the carbon layer. An electrically insulating layer is formed on the protective layer, the protective layer protecting the carbon layer from damage during the formation of the electrically insulating layer.

In accordance with another embodiment of the invention a layer arrangement is provided, the layer arrangement having a substantially carbon-comprising, electrically conductive carbon layer, a protective layer formed on the carbon layer, and an electrically insulating layer formed on the protective layer, the protective layer being used to avoid damage to the carbon layer by the electrically insulating layer.

BRIEF DESCRIPTION OF THE DRAWINGS

Exemplary embodiments of the invention are illustrated in the figures and are explained in more detail below. In the figures, identical or similar elements are provided with the same or identical reference symbols, in so far as is expedient. The illustrations shown in the figures are depicted schematically and therefore not in a manner true to scale. In the figures.

DETAILED DESCRIPTION OF ILLUSTRATIVE EMBODIMENTS

Figure 1A:
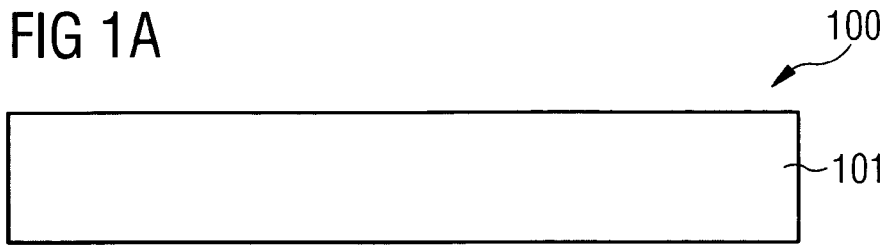
FIG. 1A shows a first method step during a method of producing a layer arrangement in accordance with one embodiment of the invention.

In the recent development of semiconductor technology, the use of electrically conductive or metallic carbon as an alternative to conventional metal materials has increasingly become the focus of interest, e.g., on account of carbon's very good properties with regard to processability and the possibility of formation in simple processes. The process of forming a carbon layer is compatible for example with conventional CMOS (Complementary Metal Oxide Semiconductor) processes. It is also possible to form entire metallization systems whose interconnects substantially have carbon.

Electrically conductive carbon layers can be formed on a substrate by deposition methods. By way of example, in one method of depositing a carbon material in or on a substrate, an interior of a process chamber may be heated to a predetermined temperature. Furthermore, the substrate is introduced into the process chamber, and the process chamber is evacuated to a predetermined pressure or below the latter. A gas having at least carbon is furthermore introduced until a second predetermined pressure is reached, which is higher than the first predetermined pressure. The carbon material is deposited from the carbon-containing gas on a surface or in a recess of the substrate.

One advantage when using carbon consists in the fact that carbon layers can be formed in such a way that they have a resistivity comparable to that of metals. In particular, what can be achieved by using carbon as material of electrodes is that in the case of small feature sizes, e.g., feature sizes of less than 100 nm, electron scattering processes in the electrodes can be reduced, with the result that the resistivity does not rise, in contrast to the rise observed in the case of metals for which, in the case of feature sizes of less than 100 nm, the resistivity provided for macroscopic systems cannot be achieved.

Another advantage of carbon consists in the higher chemical and thermal stability in comparison with metals. Thus, a carbon layer does not react, for example, with aluminum, tungsten and/or copper, and also withstands, for example, temperatures of more than 1000° C. during crystallization steps that are carried out during the formation of so-called high-k dielectrics, that is to say electrically insulating materials having a high relative permittivity.

Furthermore, deposited carbon layers can be patterned in a simple manner in order, e.g., to form electrodes of an electrical or electronic component.

In many cases it is necessary to form an electrically insulating layer (dielectric) on a carbon layer during a process step. In this case, the formation of the electrically insulating layer is often effected by means of a deposition method.

During the deposition of electrically insulating materials or insulators, to put it another way dielectric materials or dielectrics, on carbon materials, oxidizing steps are required, e.g. in the form of ozone or water. One problem is that an oxidizing environment in conjunction with the high process temperatures required leads or may lead to damage to the underlying carbon material or the underlying carbon layer. To put it another way, a carbon layer is attacked during the formation of an electrically insulating layer by an aggressive oxidizing environment and incipiently (or slightly) etched, for example. This leads to poor adhesion of the electrically insulating layer on the carbon layer and, consequently, to a poor insulation behavior of the electrically insulating layer (leaky insulator).

In accordance with one embodiment of the invention, in a method of producing a layer arrangement, a substantially carbon-comprising carbon layer is formed, the carbon layer being electrically conductive. A protective layer is formed on the carbon layer. An electrically insulating layer is formed on the protective layer, the protective layer protecting the carbon layer from damage during the formation of the electrically insulating layer.

In accordance with another embodiment of the invention a layer arrangement is provided, the layer arrangement having a substantially carbon-comprising, electrically conductive carbon layer, a protective layer formed on the carbon layer, and an electrically insulating layer formed on the protective layer, the protective layer being used to avoid damage to the carbon layer by the electrically insulating layer.

In accordance with another embodiment of the invention, the formation of a protective layer on a carbon layer prevents the carbon layer from being damaged during the formation of an electrically insulating layer or a dielectric, since the electrically insulating layer is not formed directly on the carbon layer, but rather on the protective layer formed on the carbon layer, damage to the underlying carbon material thereby being avoided.

A method of producing a layer arrangement in accordance with one embodiment of the invention can advantageously be applied, for example, if, in connection with the production of an electrical component or an electronic component, an electrically insulating layer is intended to be formed on a carbon layer and the quality of the carbon layer is intended not to be adversely affected by the formation of the electrically insulating layer.

In accordance with another embodiment of the invention, the carbon layer is formed as an electrically conductive carbon layer. Such an electrically conductive carbon layer may also be referred to as a metallic carbon layer.

In accordance with another embodiment of the invention, an electrically conductive carbon layer or a metallic carbon layer may form an electrode of an electrical component or of an electronic component.

In accordance with another embodiment of the invention, an electrically conductive carbon layer or a metallic carbon layer may form an electrical interconnect, e.g. an electrical interconnect in an electronic component or an integrated circuit.

In accordance with another embodiment of the invention, the carbon layer is formed by means of a deposition method.

In accordance with another embodiment of the invention, during a deposition method of forming the carbon layer, by way of example, an interior of a process chamber may be heated to a predetermined temperature, for example, to a temperature of between about 400° C. and about 1200° C. (for example, to about 600° C. or about 950° C.). Furthermore, a substrate may be introduced into the process chamber, and the process chamber may be evacuated to a first predetermined pressure, which may be less than about one 1 pascal (Pa), for example, less than about one eighth of a pascal. A gas having at least carbon, for example, an organic gas such as, for example, methane ($CH_4$), may furthermore be introduced until a second predetermined pressure is reached, which may be higher than the first predetermined pressure. The second predetermined pressure may, for example, lie between about 10 hPa and about 1013 hPa, for example, between about 300 hPa and about 700 hPa. The carbon material may be deposited from the carbon-containing gas, for example, the methane gas, on a surface or in a recess of the substrate. After the deposition of the carbon material, a heat treatment at 1050° C., for example, may optionally be effected.

In accordance with another embodiment of the invention the carbon layer has a thickness of between about 1 nm and about 100 nm.

In accordance with another embodiment of the invention, the protective layer is formed from an adhesion promoting material or an adhesion promoter.

In accordance with another embodiment of the invention, a hexamethyldisilizane material (HMDS), for example, may be used as the adhesion promoting material or adhesion promoter.

In accordance with another embodiment of the invention, the protective layer is formed as a carbide layer.

In accordance with another embodiment of the invention, a protective layer formed as a carbide layer may have one or more of the following materials:
  Boron carbide ($B_xC$)
  Chromium carbide ($Cr_xC_y$)
  Niobium carbide ($Nb_xC$)
  Silicon carbide (SiC)
  Titanium carbide (TiC)
  Hafnium carbide (HfC)
  Tantalum carbide (TaC)
  Tungsten carbide (WC)
  Zirconium carbide (ZrC).

Other carbide layers may alternatively be used as the protective layer.

In accordance with another embodiment of the invention the carbide layer is formed by means of a deposition method.

In accordance with another embodiment of the invention, the deposition method used for forming the carbide layer may be a vapor deposition method, for example, a chemical vapor deposition method such as chemical vapor deposition (CVD), for example, it being possible to use suitable process parameters for the deposition of carbide layers.

In accordance with another embodiment of the invention, the formation of a silicon carbide layer (SiC layer) on the carbon layer may be effected, e.g., by exposing the carbon layer to a gas mixture comprising hydrogen ($H_2$) and silicon tetrachloride ($SiCl_4$) at a temperature of about 600° C. to about 950° C. (typically at 850° C.) and a pressure of about 1 torr to about 100 torr (typically about 10 torr). In accordance with another embodiment, the silicon carbide layer may be formed by exposing the carbon layer to a gas mixture comprising hydrogen ($H_2$), argon (Ar) and silane ($SiH_4$) at a temperature of about 400° C. to about 700° C. (typically about 400° C.) and a pressure of about 1 torr to about 100 torr (typically about 10 torr).

In accordance with another embodiment of the invention, the formation of a boron carbide layer ($B_xC$ layer) on the carbon layer may be effected, e.g., by exposing the carbon layer to a gas mixture comprising boron trichloride ($BCl_3$), hydrogen ($H_2$) and argon (Ar) at a temperature of about 400° C. to about 1000° C. and a pressure of about 1 torr to about 100 torr. In accordance with another embodiment, the boron carbide layer may be formed by exposing the carbon layer to a gas mixture comprising borane ($B_2H_6$) and hydrogen ($H_2$) at a temperature of about 400° C. and a pressure of about 1 torr to about 100 torr.

In accordance with another embodiment of the invention, the formation of a chromium carbide layer ($Cr_xC_y$ layer) on the carbon layer may be effected, e.g., by exposing the carbon layer to a gas mixture comprising chromium chloride ($CrCl_2$ or $CrCl_3$), argon (Ar) and hydrogen ($H_2$) at a temperature of about 600° C. to about 1000° C. and a pressure of about 0.1 torr to about 100 torr. In accordance with another embodiment, the chromium carbide layer may be formed by decomposition of $Cr[(C_6H_5)C_3H_7]_2$ at a temperature of about 300° C. to about 500° C. and a pressure of about 0.5 torr to about 50 torr.

In accordance with another embodiment of the invention, the formation of a niobium carbide layer ($Nb_xC$ layer) on the carbon layer may be effected, e.g., by exposing the carbon layer to a gas mixture comprising niobium chloride ($NbCl_5$), tetrachloromethane ($CCl_4$) and hydrogen ($H_2$) at a temperature of about 1500° C. and a pressure of about 10 torr to about 700torr.

In accordance with another embodiment of the invention, the formation of a titanium carbide layer (TiC layer) on the carbon layer may be effected, e.g., by exposing the carbon layer to a gas mixture comprising titanium tetrachloride ($TiCl_4$), hydrogen ($H_2$) and argon (Ar) at a temperature of about 700° C. and a pressure of about 0.1 torr to about 100 torr.

In accordance with another embodiment of the invention, the formation of a hafnium carbide layer (HfC layer) on the carbon layer may be effected, e.g., by exposing the carbon layer to a gas mixture comprising hafnium tetrachloride ($HfCl_4$) and methane ($CH_4$) at a temperature of about 700° C. to about 900° C. and a pressure of about 1 torr to atmospheric pressure, whereby the HfC layer is formed in accordance with the reaction $HfCl_4+CH_4 \rightarrow HfC+4HCl$. In accordance with another embodiment, the hafnium carbide layer may be formed by exposing the carbon layer to a gas mixture comprising hafnium tetrachloride ($HfCl_4$), hydrogen ($H_2$) and argon (Ar) at a temperature of about 700° C. to about 1200° C. and a pressure of about 1 torr to about 100 torr, whereby an HfC layer is formed in accordance with the reaction $HfCl_4+CH_4 \rightarrow HfC+4HCl$.

In accordance with another embodiment of the invention, the formation of a tantalum carbide layer (TaC layer) on the carbon layer may be effected, e.g., by exposing the carbon layer to a gas mixture comprising tantalum tetrachloride ($TaCl_4$), chloromethane ($CH_3Cl$) and hydrogen ($H_2$) at a temperature of about 700° C. to about 1200° C. and a pressure of about 0.1torr to about 100 torr, whereby the TaC layer is formed in accordance with the reaction $TaCl_4+CH_3Cl+H_2 \rightarrow TaC+5HCl$. In accordance with another embodiment, the tantalum carbide layer may be formed by exposing the carbon layer to a gas mixture comprising tantalum tetrachloride ($TaCl_4$), hydrogen ($H_2$) and argon (Ar) at a temperature of about 600° C. to about 1100° C. and a pressure of about 1 torr to about 100 torr.

In accordance with another embodiment of the invention, the formation of a tungsten carbide layer (WC layer) on the carbon layer may be effected, e.g., by exposing the carbon layer to a gas mixture comprising tungsten hexachloride ($WCl_6$), methane ($CH_4$) and hydrogen ($H_2$) at a temperature of about 650° C. to about 750° C. and a pressure of about 1 torr to about 100 torr, whereby the WC layer is formed in accordance with the reaction $WCl_6+CH_4+H_2 \rightarrow WC+6HCl$. In accordance with another embodiment, the tungsten carbide layer may be formed by exposing the carbon layer to a gas mixture comprising tungsten hexafluoride ($WF_6$), methanol ($CH_3OH$) and hydrogen ($H_2$) at a temperature of about 290° C. to about 650° C. and a pressure of about 1 torr to about 700 torr, whereby a WC layer is formed in accordance with the reaction $WF_6+CH_3OH+2H_2 \rightarrow WC+6HF+H_2O$. In accordance with another embodiment, the tungsten carbide layer may be formed by decomposition of $W(CO)_6$ at a temperature of about 250° C. to about 600° C. and a pressure of about 1 torr to about 20 torr, whereby the tungsten carbide layer is formed in accordance with the reaction $W(CO)_6 \rightarrow W+6CO$.

In accordance with another embodiment of the invention, the formation of a zirconium carbide layer (ZrC layer) on the carbon layer may be effected, e.g., by exposing the carbon layer to a gas mixture comprising zirconium tetrabromide ($ZrBr_4$) and methane ($CH_4$) at a temperature of about 1300° C. and a pressure of about 1 torr to about 100 torr, whereby the ZrC layer is formed in accordance with the reaction $ZrB_4+CH_4 \rightarrow ZrC+4HBr$. In accordance with another embodiment, the zirconium carbide layer may be formed by exposing the carbon layer to a gas mixture comprising zirconium tetrabromide ($ZrBr_4$), hydrogen ($H_2$) and argon at a temperature of about 700° C. to about 1300° C. and a pressure of about 1 torr to about 100 torr.

Other carbide layers may be formed in an analogous manner.

In accordance with another embodiment of the invention, the protective layer has a thickness of between about 0.1 nm and about 10 nm.

In accordance with another embodiment of the invention, the electrically insulating layer is formed from a material having a high relative permittivity, that is to say a high-k material. Any desired high-k material may be used, such as, for example, aluminium oxide ($Al_2O_3$), hafnium silicate (HfSiO) or zirconium oxide ($ZrO_2$).

The electrically insulating layer may be formed by means of at least one oxidizing step, which at least one oxidizing step may be effected, for example, using water and/or ozone.

In accordance with another embodiment of the invention, the electrically insulating layer is formed by means of a deposition method.

The deposition method used for forming the electrically insulating layer may be a vapor deposition method, for example a chemical vapor deposition method such as, for example, chemical vapor deposition (CVD).

In accordance with another embodiment of the invention, the electrically insulating layer is formed from an oxide material, for example, from silicon dioxide ($SiO_2$).

In accordance with another embodiment of the invention, at least one additional layer is formed on or above the electrically insulating layer. In other words, a single additional layer or else a layer sequence having a plurality of additional layers arranged one above another may be formed on the electrically insulating layer. As an alternative, it is also possible to form a plurality of additional layers on the electrically insulating layer, it being possible for each individual one of the plurality of additional layers to be formed, in each case, on a portion of the electrically insulating layer.

One advantage of an embodiment of the invention may be seen in the fact that forming a very thin protective layer (for example, a carbide layer having a thickness in the nanometers range or even sub-nanometers range) on a metallic carbon layer facilitates the deposition of one or a plurality of subsequent layers in an oxidizing environment. The protective layer has the effect that the carbon layer is not attacked by an oxidizing step, and thus not damaged, during the formation of an electrically insulating layer or a dielectric (e.g., in the form of an oxide layer). To put it another way, possible incipient etching of the carbon layer by an oxidization step is avoided with the aid of the protective layer formed on the carbon layer.

In accordance with another embodiment of the invention at least one of the at least one additional layer is formed as a substantially carbon-comprising carbon layer and/or as a metal layer.

In accordance with another embodiment of the invention, an additional layer formed as a carbon layer may be formed as an electrically conductive carbon layer or a metallic carbon layer.

In accordance with another embodiment of the invention a method of producing an electrical component is provided, which method involves forming a layer arrangement by means of a method of producing a layer arrangement in accordance with one embodiment of the invention, an electrically conductive layer being formed on the electrically insulating layer of the layer arrangement, so that a capacitor is formed.

In accordance with another embodiment of the invention, the electrically conductive layer is formed as a second substantially carbon-comprising carbon layer. The second electrically conductive carbon layer may also be referred to as a second metallic carbon layer, so that a metal-insulator-metal (MIM) capacitor is formed in accordance with this embodiment.

A capacitor formed in the manner described above has a first electrode, which first electrode is formed by the metallic carbon layer, and also a second electrode, which is formed by the second metallic carbon layer. The electrically insulating layer or the dielectric (e.g., a high-k material) is formed between the first electrode and the second electrode, the protective layer (e.g., a carbide layer) being formed between the electrically insulating layer and the first electrode or the metallic carbon layer.

In accordance with another embodiment of the invention, the electrically conductive layer may be formed as a metal layer, so that an MIM capacitor is likewise formed having a first electrode formed by the metallic carbon layer and also a second electrode formed by the metal layer.

In accordance with one embodiment of the invention, it is made possible, by means of a method of producing a layer arrangement, to form over a carbon layer, e.g., an electrically conductive carbon layer or metallic carbon layer, an electrically insulating layer or a dielectric in an oxidizing environment, e.g., by means of a deposition method, without the carbon layer in this case being attacked or damaged by one or a plurality of oxidation processes. This is achieved by forming on the carbon layer a thin protective layer, e.g., made of an adhesion promoting material (adhesion promoter) or made of a carbide material.

A method of producing a layer arrangement in accordance with one embodiment of the invention can advantageously be applied, for example, when a dielectric, e.g., an oxide layer, for electrical insulation is intended to be formed over a carbon layer. The underlying carbon layer is not damaged by the formation of the oxide layer since the carbon layer is protected by the protective layer.

One or a plurality of additional layers may subsequently be formed on the oxide layer, generally on the electrically insulating layer. Thus, a metal-insulator-metal capacitor may be formed, for example, by forming a metal layer or a second electrically conductive carbon layer on the electrically insulating layer.

Another embodiment of the invention provides for the electrically conductive carbon layer to be used as an interconnect, and for the method to be used to achieve an electrical insulation of the interconnect by forming an electrically insulating layer (e.g., an oxide layer) as insulator, the formation of the protective layer between the interconnect (that is to say the carbon layer) and the insulator (that is to say the electrically insulating layer) preventing the interconnect or the carbon layer from being damaged, e.g., by incipient etching in an oxidizing environment, during the formation of the insulator or the electrically insulating layer.

Another embodiment of the invention provides for a layer arrangement having a plurality of metallization planes (or metallization levels) to be produced by the method, one or a plurality of interconnects having an electrically conductive carbon material being formed in each metallization plane. Electrically insulating layers (intermetal dielectrics, IMD) may in each case be formed between the individual metallization planes, the formation of a protective layer (e.g., a carbide layer) on a carbon interconnect preventing the carbon interconnect from being damaged during the formation of the intermetal dielectric or the electrically insulating layer.

In accordance with another embodiment of the invention, a metallic carbon layer, which is provided as a first interconnect, may be formed, for example, and a protective layer (e.g. a carbide layer) may be formed on the carbon layer. An electrically insulating layer or a first intermetal dielectric may be formed on the protective layer, the carbon layer or the first interconnect being protected by the protective layer. A second electrically conductive carbon layer, which is provided as a second interconnect, may be formed on the electrically insulating layer. On the second interconnect, once again a protective layer may be formed, and subsequently a second electrically insulating layer, the second carbon layer being protected by the second protective layer from damage by the second electrically insulating layer. By repeating the process steps described above, it is possible to produce a layer arrangement having any desired predetermined number of metallization planes, it being possible for one or more interconnects made of metallic carbon to be formed in each metallization plane.

The interconnects formed in adjacent metallization planes may additionally be electrically connected to one another by the formation of one or more contact holes (vias) in the electrically insulating layer (intermetal dielectric) formed between the metallization planes.

A method of producing a layer arrangement in accordance with one embodiment of the invention can advantageously be applied, for example, in the production of a wide variety of electrical or electronic components, to be precise whenever an electrically insulating layer is intended to be formed on a carbon layer and at the same time a carbon layer is intended to be prevented from being attacked or damaged during the formation of the electrically insulating layer, e.g., on account of an oxidizing step.

One advantage of exemplary embodiments of the invention may be seen in the fact that a carbon layer is protected from damage, which damage is caused by the formation of an electrically insulating layer on the carbon layer.

FIG. 1A shows a first method step during a method of producing a layer arrangement in accordance with one embodiment of the invention.

The layer arrangement 100 as shown in FIG. 1A is obtained by forming a substantially carbon-comprising carbon layer 101 in the first method step, for example, on a substrate (not shown). The carbon layer 101 is formed as an electrically conductive carbon layer 101 or metallic carbon layer 101. The carbon layer 101 may be formed, for example, by means of a deposition method.

By way of example, an interior of a process chamber may be heated to a predetermined temperature, for example, to a temperature of between about 400° C. and about 1200° C. (for example, to about 600° C. or about 950° C.). Furthermore, a substrate may be introduced into the process chamber, and the process chamber may be evacuated to a first predetermined pressure, which may be less than about one pascal (Pa), for example, less than about one eighth of a pascal. A gas having at least carbon, for example an organic gas such as, for example, methane ($CH_4$), may furthermore be introduced until a second predetermined pressure is reached, which may be higher than the first predetermined pressure. The second predetermined pressure may lie, for example, between about 10 hPa and about 1013 hPa, for example, between about 300 hPa and about 700 hPa. The carbon material may be deposited from the carbon-containing gas, for example, the methane gas, on a surface of the substrate, as a result of which the carbon layer 101 is formed. A heat treatment at about 1050° C., for example, may optionally be effected after the deposition of the carbon material.

The carbon layer 101 may have a thickness of between about 1 nm and about 100 nm.

Figure 1B:
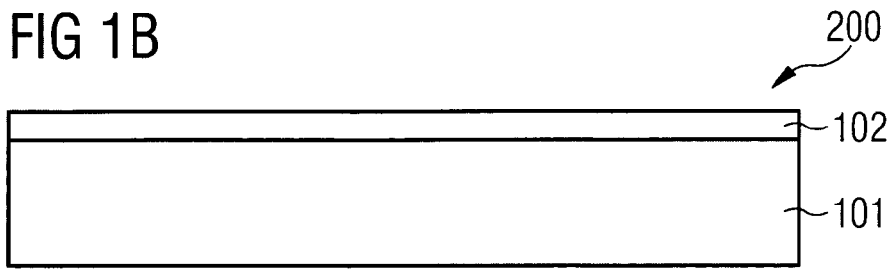
FIG. 1B shows a second method step during the method of producing a layer arrangement in accordance with an embodiment of the invention.

FIG. 1B shows a second method step during the method of producing a layer arrangement in accordance with one embodiment of the invention.

The layer arrangement 200 shown in FIG. 1B is obtained by forming a protective layer 102 on the carbon layer 101 in the second method step. The protective layer 102 is formed as a silicon carbide layer (SiC layer).

The formation of the protective layer 102 formed as an SiC layer on the carbon layer 101 may be effected, e.g., by exposing the carbon layer 101 to a gas mixture comprising hydrogen ($H_2$) and silicon tetrachloride ($SiCl_4$) at a temperature of about 600° C. to about 950° C. (typically at about 850° C.) and a pressure of about 1 torr to about 100 torr (typically about 10 torr). As an alternative, the silicon carbide layer 102 may be formed by exposing the carbon layer 101 to a gas mixture comprising hydrogen ($H_2$), argon (Ar) and silane ($SiH_4$) at a temperature of about 400° C. to about 700° C. (typically about 400° C.) and a pressure of about 1 torr to about 100 torr (typically about 10 torr).

As an alternative or in addition, the protective layer 102 formed as a carbide layer may also have one or more of the following carbide materials: boron carbide, chromium carbide, niobium carbide, titanium carbide, hafnium carbide, tantalum carbide, tungsten carbide, zirconium carbide.

A protective layer 102 formed as a boron carbide layer ($B_xC$ layer) may be formed by exposing the carbon layer 101 to a gas mixture comprising boron trichloride ($BCl_3$), hydrogen ($H_2$) and argon (Ar) at a temperature of about about 400° C. to about about 1000° C. and a pressure of about about 1 torr to about about 100 torr. As an alternative, a protective layer 102 formed as a boron carbide layer may be formed by exposing the carbon layer 101 to a gas mixture comprising borane ($B_2H_6$) and hydrogen ($H_2$) at a temperature of about 400° C. and a pressure of about 1 torr to about 100 torr.

A protective layer 102 formed as a chromium carbide layer ($Cr_xC_y$ layer) may be formed by exposing the carbon layer 101 to a gas mixture comprising chromium chloride ($CrCl_2$ or $CrCl_3$), argon (Ar) and hydrogen ($H_2$) at a temperature of about 600° C. to about 1000° C. and a pressure of about 0.1 torr to about 100 torr. As an alternative, a protective layer 102 formed as a chromium carbide layer may be formed by decomposition of $Cr[(C_6H_5)C_3H_7]_2$ at a temperature of about 300° C. to about 500° C. and a pressure of about 0.5 torr to about 50 torr.

A protective layer 102 formed as a niobium carbide layer ($Nb_xC$ layer) may be formed by exposing the carbon layer 101 to a gas mixture comprising niobium chloride ($NbCl_5$), tetrachloromethane ($CCl_4$) and hydrogen ($H_2$) at a temperature of about 1500° C. and a pressure of about 10 torr to about 700 torr.

A protective layer 102 formed as a titanium carbide layer (TiC layer) may be formed by exposing the carbon layer 101 to a gas mixture comprising titanium tetrachloride ($TiCl_4$), hydrogen ($H_2$) and argon (Ar) at a temperature of about 700° C. and a pressure of about 0.1 torr to about 100 torr.

A protective layer 102 formed as a hafnium carbide layer (HfC layer) may be formed by exposing the carbon layer 101 to a gas mixture comprising hafnium tetrachloride ($HfCl_4$) and methane ($CH_4$) at a temperature of about 700° C. to about 900° C. and a pressure of about 1 torr to atmospheric pressure, whereby the HfC layer is formed in accordance with the reaction $HfCl_4+CH_4 \rightarrow HfC+4HCl$. As an alternative, a protective layer 102 formed as a hafnium carbide layer may be formed by exposing the carbon layer 101 to a gas mixture comprising hafnium tetrachloride ($HfCl_4$), hydrogen ($H_2$) and argon (Ar) at a temperature of about 700° C. to about 1200° C. and a pressure of about 1 torr to about 100 torr, whereby an HfC layer is formed in accordance with the reaction $HfCl_4+CH_4 \rightarrow HfC+4HCl$.

A protective layer 102 formed as a tantalum carbide layer (TaC layer) may be formed by exposing the carbon layer 101 to a gas mixture comprising tantalum tetrachloride ($TaCl_4$), chloromethane ($CH_3Cl$) and hydrogen ($H_2$) at a temperature of about 700° C. to about 1200° C. and a pressure of about 0.1 torr to about 100 torr, whereby the TaC layer is formed in accordance with the reaction $TaCl_4+CH_3Cl+H_2 \rightarrow TaC+5HCl$. As an alternative, a protective layer 102 formed as a tantalum carbide layer may be formed by exposing the carbon layer 101 to a gas mixture comprising tantalum tetrachloride ($TaCl_4$), hydrogen ($H_2$) and argon (Ar) at a temperature of about 600° C. to about 1100° C. and a pressure of about 1 torr to about 100 torr.

A protective layer 102 formed as a tungsten carbide layer (WC layer) may be formed by exposing the carbon layer 101 to a gas mixture comprising tungsten hexachloride ($WCl_6$), methane ($CH_4$) and hydrogen ($H_2$) at a temperature of about 650° C. to about 750° C. and a pressure of about 1 torr to about 100 torr, whereby the WC layer is formed in accordance with the reaction $WCl_6+CH_4 30\ H_2 \rightarrow WC+6HCl$. As an alternative, a protective layer 102 formed as a tungsten carbide layer may be formed by exposing the carbon layer to a gas mixture comprising tungsten hexafluoride ($WF_6$), methanol ($CH_3OH$) and hydrogen ($H_2$) at a temperature of about 290° C. to about 650° C. and a pressure of about 1 torr to about 700 torr, whereby a WC layer is formed in accordance with the reaction $WF_6+CH_3OH+2H_2 \rightarrow WC+6HF+H_2O$. Furthermore, a protective layer 102 formed as a tungsten carbide layer may be formed by decomposition of $W(CO)_6$ at a temperature of about 250° C. to about 600° C. and a pressure of about 1 torr to about 20 torr, whereby the tungsten carbide layer is formed in accordance with the reaction $W(CO)_6 \rightarrow W+6CO$.

A protective layer 102 formed as a zirconium carbide layer (ZrC layer) may be formed by exposing the carbon layer 101 to a gas mixture comprising zirconium tetrabromide ($ZrBr_4$) and methane ($CH_4$) at a temperature of about 1300° C. and a pressure of about 1 torr to about 100 torr, whereby the ZrC layer is formed in accordance with the reaction $ZrB_4+CH_4 \rightarrow ZrC+4HBr$. As an alternative, a protective layer 102 formed as a zirconium carbide layer may be formed by exposing the carbon layer 101 to a gas mixture comprising zirconium tetrabromide ($ZrBr_4$), hydrogen ($H_2$) and argon at a temperature of about 700° C. to about 1300° C. and a pressure of about 1 torr to about 100 torr.

The protective layer 102 formed as a silicon carbide layer is formed by means of a chemical vapor deposition method such as, for example, chemical vapor deposition.

In an alternative embodiment, a protective layer 102 made of an adhesion promoting material (e.g., made of HMDS) may be formed instead of a protective layer 102 formed as a carbide layer.

Figure 1C:
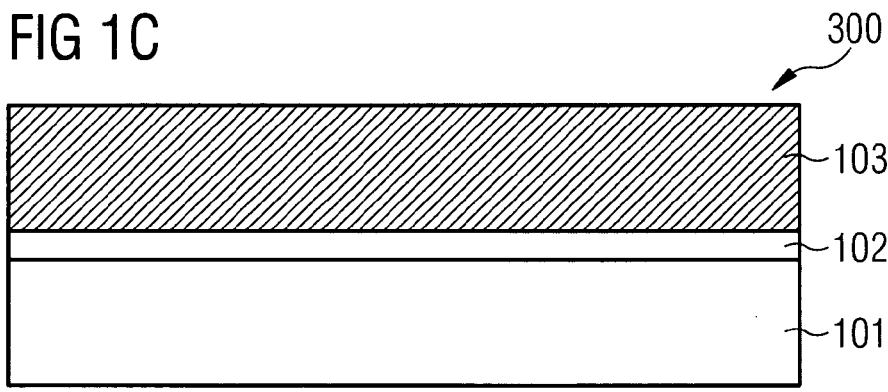
FIG. 1C shows a layer arrangement in accordance with one embodiment of the invention.

FIG. 1C shows a layer arrangement 300 in accordance with one embodiment of the invention.

The layer arrangement 300 is obtained by forming an electrically insulating layer 103 on the protective layer 102 in a third method step of the method of producing a layer arrangement in accordance with the exemplary embodiment of the invention. The electrically insulating layer 103 is formed from an oxide material; to put it another way, the electrically insulating layer 103 is formed as an oxide layer (for example, as a silicon dioxide layer) by means of an oxidizing step.

As an alternative, an electrically insulating layer 103 made of any desired high-k material (e.g., made of aluminum oxide, hafnium silicate or zirconium oxide) may be deposited on the protective layer 102.

The formation of the electrically insulating layer 103 or the oxide layer 103 is effected in an oxidizing environment, the thin protective layer 102 preventing the carbon layer 101 from being damaged by the oxidizing step during the formation of the electrically insulating layer 103 or the oxide layer 103. To put it another way, the protective layer 102 prevents, for example, the carbon layer 101 from being attacked by the oxidizing environment required for forming the electrically insulating oxide layer 103.

What is achieved by preventing damage to the carbon layer 101 by means of the protective layer 102 is that the electrically insulating layer 103 adheres better. The better adhesion of the electrically insulating layer in turn leads to an improved insulation effect of the electrically insulating layer 103 or the dielectric 103.

Figure 2:
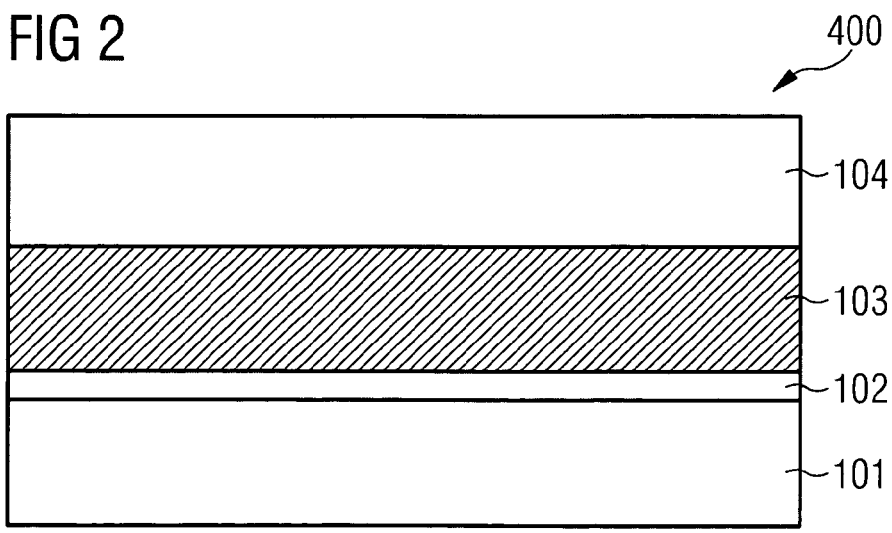
FIG. 2 shows a layer arrangement in accordance with another embodiment of the invention.

FIG. 2 shows a layer arrangement 400 in accordance with another embodiment of the invention.

The layer arrangement 400 is obtained by forming an additional layer 104 on the electrically insulating layer 103 of the layer arrangement 300 shown in FIG. 1C The additional layer 104 is formed as a second electrically conductive carbon layer 104, to put it another way as a second metallic carbon layer 104.

The layer arrangement 400, therefore, forms an electrical component 400, more precisely a metal-insulator-metal capacitor 400 having a first metal electrode made of metallic carbon material, i.e., the electrically conductive carbon layer 101, having a second metal electrode made of metallic carbon material, i.e., the second electrically conductive carbon layer 104, and also having a dielectric 103, i.e., the electrically insulating oxide layer 103, between the first metal electrode 101 and the second metal electrode 104, the protective layer 102 being formed between the dielectric 103 and the first metal electrode 101.

A metal layer 104 may also be formed instead of the use of an electrically conductive carbon material for the second electrode 104 of the capacitor 400.

The fact that the protective layer 102 is formed between the electrically insulating layer 103, that is to say the dielectric 103, of the capacitor 400 and the first electrode 101, that is to say the carbon layer 101, prevents damage to the carbon layer 101 by the electrically insulating layer 103. Consequently, an improved adhesion of the electrically insulating layer 103 on the carbon layer 101 or on the protective layer 102 formed on the carbon layer 101 is obtained, and thus an improved insulation behavior or a better insulating effect of the electrically insulating layer 103.

Figure 3:
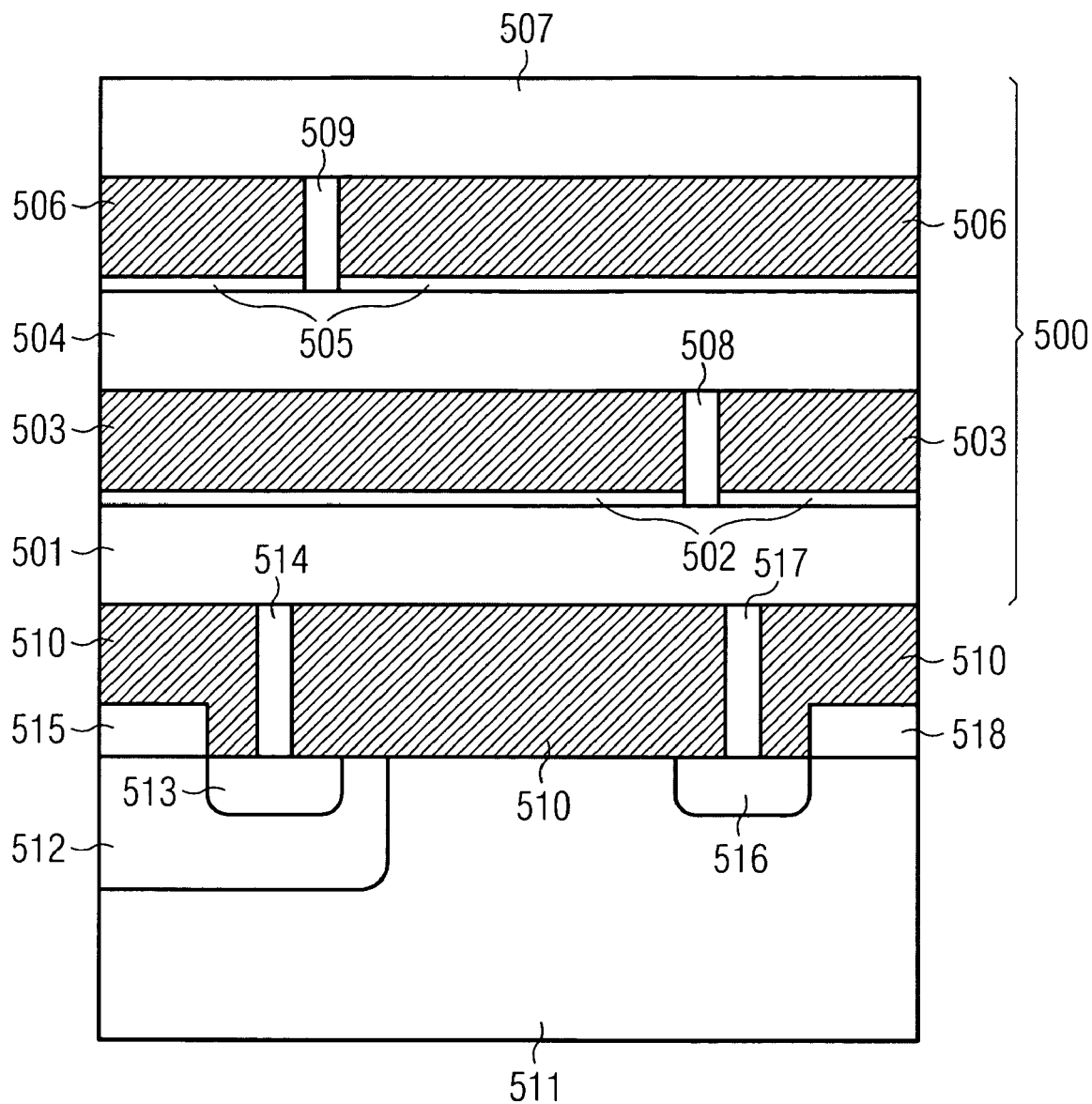
FIG. 3 shows a layer arrangement in accordance with another embodiment of the invention.

FIG. 3 shows a layer arrangement 500 in accordance with another embodiment of the invention.

The layer arrangement 500 has an electrically conductive (metallic) carbon layer 501, which electrically conductive carbon layer 501 is formed as a first electrical interconnect. A protective layer 502 (e.g., a carbide layer) is formed on the carbon layer 501 and an electrically insulating layer or an intermetal dielectric 503 is formed on the protective layer 502. A second metallic carbon layer 504 is formed on the electrically insulating layer 503, which second metallic carbon layer 504 is formed as a second electrical interconnect. A second protective layer 505 (e.g., a second carbide layer) is in turn formed on the second metallic carbon layer 504 or the second electrical interconnect 504. A second electrically insulating layer 506 or a second intermetal dielectric 506 is formed on the second protective layer 505. A third metallic carbon layer 507 is formed on the second electrically insulating layer 506, which third metallic carbon layer 507 is formed as a third electrical interconnect.

The fact that the protective layer 502 is formed on the carbon layer 501 protects the latter from damage by the electrically insulating layer 503. In an analogous manner, the second carbon layer 504 is protected by the second protective layer 505 from damage by the second electrically insulating layer 506.

The carbon layer 501 and the second carbon layer 504 are electrically connected to one another by means of a first contact hole 508 (first via 508) formed in the electrically insulating layer 503 and in the protective layer 502. The contact hole 508 or via 508 may be formed after the formation of the electrically insulating layer 503 by means of conventional patterning methods (e.g., lithography methods and/or etching methods). In an analogous manner, the second carbon layer 504 and the third carbon layer 507 are electrically contact-connected to one another by a second contact hole 509.

The layer arrangement 500 shown in FIG. 3 thus has a plurality of metallization planes, an electrical interconnect being formed in each metallization plane. In concrete terms, the first electrical interconnect 501, that is to say the carbon layer 501, is formed in a first metallization plane, the second electrical interconnect 504, that is to say the second carbon layer 504, is formed in a second metallization plane, and the third electrical interconnect 507, that is to say the third carbon layer 507, is formed in a third metallization plane.

As an alternative or in addition, further electrical interconnects having electrically conductive carbon material may be formed in one or more of the metallization planes (not shown). It is likewise possible to form, in addition to the metallization planes shown in FIG. 3, further metallization planes, which may have carbon layers formed as electrical interconnects, it being possible for one or a plurality of electrically insulating layers (e.g., intermetal dielectrics) to be formed between in each case two metallization planes.

It should be noted in this connection that each time an additional metallization plane is formed, a carbon layer may be protected from damage (e.g., caused by an aggressive oxidizing step required during the formation of an intermetal dielectric) by forming a thin protective layer (e.g., a carbide layer or a layer made of an adhesion promoting material) on the carbon layer.

The layer arrangement 500 shown in FIG. 3 is formed on a third electrically insulating layer 510 (e.g., a silicon dioxide layer), which third electrically insulating layer 510 is in turn formed on a substrate 511 (e.g., a silicon substrate). The substrate may be doped, for example p-doped. A doped well region 512 is formed in the substrate, it being possible for the doping of the well region 512 to be opposite to the doping of the substrate 511. In the case of a p-doped substrate 511, the well region 512 may be, e.g., n-doped. A first source/drain region 513 is formed in the doped well region 512, which first source/drain region 513 has a doping opposite to the doping of the well region 512, or a doping of the same type as the doping of the substrate 511. In the case of a p-doped substrate 511 or an n-doped well region 512, the first source/drain region 513 may be heavily p-doped ($p^+$), for example. The first source/drain region 513 is electrically connected to the first electrical interconnect 501, that is to say the carbon layer 501 of the layer arrangement 500, by means of a third contact hole 514 (third via 514) formed in the third electrical layer 510. Moreover, a first gate region 515 is formed in the third electrically insulating layer 510 or on the well region 512, which first gate region 515 may have, for example, a first gate insulating layer and a first conductive gate layer (first gate electrode) formed on the first gate insulating layer (not shown in FIG. 3). The first source/drain region 513 and the first gate region 515 may be part of a first field effect transistor, for example, a PMOS field effect transistor in the case of a p-doped or p$^+$-doped first source/drain region 513. The PMOS field effect transistor may have a further p-doped or p$^+$-doped source/drain region formed in the well region 512 (not shown).

A second source/drain region 516 is furthermore formed in the substrate 511, which second source/drain region 516 has a doping opposite to the doping of the substrate 511. In the case of a p-doped substrate 511, the second source/drain region 516 may be heavily n-doped (n$^+$), for example. The second source/drain region 516 is electrically connected to the first electrical interconnect 501, that is to say the carbon layer 501 of the layer arrangement 500, by means of a fourth contact hole 517 (fourth via 517). Moreover, a second gate region 518 is formed in the third electrically insulating layer 510 or on the substrate 511, which second gate region 518 may have, for example, a second gate insulating layer and a second conductive gate layer (second gate electrode) formed on the second gate insulating layer (not shown in FIG. 3). The second source/drain region 516 and the second gate region 518 may be part of a second field effect transistor, for example, an NMOS field effect transistor in the case of an n-doped or n$^+$-doped second source/drain region 516. The NMOS field effect transistor may have a further n-doped or n$^+$-doped source/drain region formed in the substrate 511 (not shown).

The first source/drain region 513 of the PMOS field effect transistor and the second source/drain region 516 of the NMOS field effect transistor are electrically connected to one another by means of the third contact hole 514 formed in the third electrically insulating layer 510, the first electrical interconnect 501 formed on the third electrically insulating layer 510 (that is to say the metallic carbon layer 501 of the layer arrangement 500) and the fourth contact hole 517 formed in the third electrically insulating layer 510.

The PMOS field effect transistor and the NMOS field effect transistor may be part of an integrated circuit, e.g., a CMOS inverter, and the layer arrangement 500 or the first electrical interconnect 501 (carbon layer 501), second electrical interconnect 504 (second carbon layer 504) and third electrical interconnect 507 (third carbon layer 507) formed in the layer arrangement 500 may serve for making electrical contact with partial elements of the integrated circuit.

Although exemplary embodiments of the present invention and their advantages have been described in detail, it should be noted that diverse changes, substitutions and innovations may be made in respect thereof without departing from the spirit and scope of the invention as defined by the subsequent claims. By way of example, it is readily evident to a person skilled in the art that many of the features, functions, processes and materials described herein can be altered in such a way that the alterations made still lie within the scope of the present invention. Furthermore, it is not intended that the scope of the present invention be restricted to the specific embodiments of the process, machinery, production, material composition, means, methods or steps which are mentioned in the description. As the average person skilled in the art can readily gather from the disclosure of the present invention, it is possible in accordance with the present invention also to utilize processes, machines, production methods, material compositions, means, methods or steps which currently exist or will be developed in the future and which essentially fulfill the same task or essentially achieve the same result as the corresponding embodiments which have been described here. Accordingly, the subsequent claims are intended to include such processes, machines, production methods, material compositions, means, methods or steps within their scope.

What is claimed is:

1. A method of producing a layer arrangement, the method comprising:
    depositing a substantially carbon-comprising, electrically conductive carbon layer on a carrier;
    forming a protective layer over the carbon layer; and
    forming an electrically insulating layer using at least one oxidizing process over the protective layer, the protective layer protecting the carbon layer from damage during the formation of the electrically insulating layer, and increasing the adhesion of the electrically insulating layer.

2. The method according to claim 1, wherein forming the carbon layer comprises: depositing the carbon layer to a thickness of between about 1 nm and about 100 nm.

3. The method according to claim 1, wherein the protective layer is formed from an adhesion promoting material.

4. The method according to claim 3, wherein the adhesive promoting material comprises a hexamethyldisilizane material.

5. The method according to claim 1, wherein the protective layer is formed as a carbide layer.

6. The method according to claim 5, wherein the carbide layer comprises at least one material selected from the group consisting of $B_xC$, $Cr_xC_y$, $Nb_xC$, SiC, TiC, HfC, TaC, WC, or ZrC.

7. The method according to claim 6, wherein the carbide layer is formed by a deposition method.

8. The method according to claim 7, wherein the deposition method is a chemical vapor deposition method.

9. The method according to claim 1, wherein the protective layer is formed to a thickness of between about 0.1 nm and about 10 nm.

10. The method according to claim 1, wherein the electrically insulating layer is formed from a material having a high relative permittivity.

11. The method according to claim 1, wherein the at least one oxidizing step is effected using water or ozone.

12. The method according to claim 1, wherein the electrically insulating layer is formed by means of a deposition method.

13. The method according to claim 12, wherein the deposition method is a chemical vapor deposition method.

14. The method according to claim 1, further comprising: forming at least one additional layer on or over the electrically insulating layer.

15. The method according to claim 14, wherein the at least one additional layer is formed as a substantially carbon-comprising carbon layer or as a metal layer.

16. The method according to claim 15, wherein the at least one additional layer is formed as an electrically conductive carbon layer.

17. The method according to claim 15, further comprising: forming an electrically conductive layer over the electrically insulating layer, so that a capacitor is formed.

18. The method according to claim 17, wherein the electrically conductive layer is formed as a substantially carbon-comprising carbon layer or as a metal layer, so that a metal-insulator-metal capacitor is formed.

19. A layer arrangement, comprising:
    a substantially carbon-comprising, electrically conductive carbon layer deposited on a carrier;
    a protective layer formed over the carbon layer; and an electrically insulating oxide layer formed over the protective layer, the protective layer selected to avoid damage to the carbon layer during formation of the electrically insulating oxide layer using at least one oxidizing process, thereby increasing the adhesion of the electrically insulating layer.

20. The arrangement according to claim 19, further comprising: an electrically conductive layer formed on the electrically insulating layer, wherein the carbon layer, the electrically insulating layer and the electrically conductive layer form a capacitor.

21. The arrangement according to claim 20, wherein the electrically conductive layer comprises a substantially carbon-comprising carbon layer.

22. The arrangement according to claim 20, wherein the electrically conductive layer comprises a substantially carbon-comprising metal layer.

* * * * *